(12) United States Patent
Hamada

(10) Patent No.: US 7,778,060 B2
(45) Date of Patent: Aug. 17, 2010

(54) FERROELECTRIC MEMORY

(75) Inventor: Yasuaki Hamada, Suwa (JP)

(73) Assignee: Seiko Epson Corporation (JP)

( * ) Notice: Subject to any disclaimer, the term of this patent is extended or adjusted under 35 U.S.C. 154(b) by 478 days.

(21) Appl. No.: 11/733,891

(22) Filed: Apr. 11, 2007

(65) Prior Publication Data

US 2008/0037312 A1    Feb. 14, 2008

(30) Foreign Application Priority Data

Apr. 18, 2006    (JP)    ............................... 2006-114658

(51) Int. Cl.
    *G11C 11/22*    (2006.01)
(52) U.S. Cl. ..................... 365/145; 365/63; 365/149; 365/210; 365/191
(58) Field of Classification Search ................. 365/145, 365/65, 49.13, 149, 210, 191, 185.02
    See application file for complete search history.

(56) References Cited

U.S. PATENT DOCUMENTS 3,105,225 A  *  9/1963  Williams et al. ............ 365/145
5,086,412 A  *  2/1992  Jaffe et al. .................. 365/145
5,262,982 A  *  11/1993 Brassington et al. ........ 365/145

FOREIGN PATENT DOCUMENTS

| JP | 09-180467 | 7/1997 |
|---|---|---|
| JP | 11-191295 | 7/1999 |
| JP | 2001-160286 | 6/2001 |

\* cited by examiner

*Primary Examiner*—Pho M Luu
*Assistant Examiner*—Tha-O Bui
(74) *Attorney, Agent, or Firm*—Harness, Dickey & Pierce, P.L.C.

(57) ABSTRACT

A ferroelectric memory includes: a memory cell having a ferroelectric capacitor, wherein, in a read-out operation, a first signal $Q_1$ is given when a first voltage is applied to the ferroelectric capacitor, and a second signal $Q_2$ is given when a second voltage having an identical magnitude as a magnitude of the first voltage in a different polarity is applied to the ferroelectric capacitor, and a judgment is made that the memory cell stores first data when $Q_1/Q_2$ is greater than ½, and second data when $Q_1/Q_2$ is smaller than ½.

8 Claims, 9 Drawing Sheets

EXAMPLE OF DEFECTIVE MODE (CAPACITOR AREA IRREGULARITY)

EXAMPLE OF DEFECTIVE MODE (CAPACITOR DETERIORATION)

CAPACITOR AREA DEPENDENCY OF READ-OUT SIGNAL
AMOUNT ACCORDING TO COMPARISON EXAMPLE (V = 0 → VCC)

CAPACITOR REMANENT POLARIZATION DEPENDENCY OF READ-OUT SIGNAL AMOUNT ACCORDING TO PRESENT EMBODIMENT

FERROELECTRIC MEMORY

The entire disclosure of Japanese Patent Application No. 2006-114658, filed Apr. 18, 2006 is expressly incorporated by reference herein.

BACKGROUND

1. Technical Field

The present invention relates to ferroelectric memories.

2. Related Art

A ferroelectric memory is characterized by nonvolatility, high-speed reading/writing and low power consumption, and is one of the strong candidates of the next generation nonvolatile memories.

One of the most popular ferroelectric memory structures is a 1T1C type structure, in which each of its memory cells is composed of a transistor and a ferroelectric capacitor. The 1T1C type ferroelectric memory is characterized in that a common reference memory cell is separately provided for a plurality of memory cells, and a read-out signal for each of the memory cells and a reference signal for the reference memory cell are compared with each other at the time of read-out operation. However, the 1T1C type structure has a drawback in that deterioration of the characteristic of the reference memory cell and differences in the characteristic of the memory cells would cause read-exit errors. A method to address such a problem has been adopted, which uses a 2T2C type structure in which one of adjacent two memory cells is used as a memory cell for storing a read-out signal and the other is used as a reference memory cell for storing a reference signal. However, the 2T2C structure needs reference memory cells in the same number as that of memory cells, and therefore a reduction in area of a ferroelectric memory and a higher level of integration are difficult.

In order to solve the problem of deterioration of reference memory cells in 1T1C type ferroelectric memories, attempts have been made to obtain two signals, a read-out signal and a reference signal for the same memory cell. For example, according to Japanese Laid-open Patent Application JP-A-9-180467, a read-out signal and a "1" read-out signal are compared. As a comparing method, a potential difference detected by a sense amplifier caused by a "1" read-out signal after a read-out signal is compared with a reference voltage. Also, in Japanese Laid-open Patent Application JP-A-11-191295, a read-out signal and a "0" read-out signal are compared. As a comparing method, the two signals are inputted in independent differential sense amplifiers, respectively, and compared with each other. Further, in Japanese Laid-open Patent Application JP-A-2001-180286, a read-out signal and a "1" read-out signal are compared, like the method described in Japanese Laid-open Patent Application JP-A-9-180467. As a comparing method, the read-out signals are buffered in independent capacitors, respectively, and then compared by using an evaluator.

SUMMARY

In accordance with an advantage of some aspects of the present invention, there is provided a ferroelectric memory that can judge read-out data by a single memory cell, and that is difficult to be affected by deterioration of its ferroelectric capacitor.

(1) A ferroelectric memory in accordance with art embodiment of the invention includes: a memory cell having a ferroelectric capacitor wherein a first signal $Q_1$ is given when a first voltage is applied to the ferroelectric capacitor in a read-out operation, and a second signal $Q_2$ is given when a second voltage having the same magnitude as that of the first voltage in a different polarity is applied to the ferroelectric capacitor, wherein a determination is made that the memory cell stores first data when $Q_1/Q_2$ is greater than ½, and second data when $Q_1/Q_2$ is smaller than ½.

By the ferroelectric memory, read-out data can be judged with a single memory cell, and thus it is not necessary to provide a reference memory cell separately, such that a reduction in area of the ferroelectric memory and a higher level of integration can be achieved. Data in a memory cell is judged based on a ratio between the first and second signals. Therefore, the ratio between the two signals is not influenced even when a change occurs in the characteristics of the ferroelectric capacitor due to deterioration thereof, such that read-out data can be accurately judged. Furthermore, for similar reasons, even when differences are present in the areas or the like of the ferroelectric capacitors in the memory cells, reading errors do not occur and therefore read-out data can be accurately judged.

(2) The ferroelectric memory may further include a first retention circuit that retains the first signal, and a comparison circuit that judges based on the first and second signals as to whether the memory cell stores the first data or the second data.

According to the above, the first signal is retained at the first retention circuit and the first signal can be sent to the comparison circuit at a predetermined timing. As a result, data can be accurately judged at the comparison circuit.

(3) The ferroelectric memory may further include an amplification circuit that doubles the first signal, wherein the comparison circuit judges that the memory cell stores the first data when $2Q_1$ is greater than $Q_2$, and the second data when $2Q_1$ is smaller than $Q_2$.

Because the amplification circuit is provided, the structure of the comparison circuit can be simplified as the comparison circuit only needs to compare the magnitudes of the signals.

(4) The ferroelectric memory described above may further include a second retention circuit that retains the second signal, wherein the comparison circuit may take in the first and second signals supplied from the first and second retention circuits.

(5) In the ferroelectric memory, the first signal may be based on a variation in the amount of polarization generated when the voltage applied to the ferroelectric capacitor changes from 0V to the first voltage and returns again to 0V, and the second signal may be based on a variation in the amount of polarization generated when the voltage applied to the ferroelectric capacitor changes from 0V to the second voltage and returns again to 0V.

(6) The ferroelectric memory may further include a bit line connected through a transistor to one end of the ferroelectric capacitor, and a plate line connected to the other end of the ferroelectric capacitor.

(7) In the ferroelectric memory, the first voltage may be a positive voltage that is applied to the plate line, the second voltage may be a positive voltage that is applied to the bit line, wherein the first signal may be read from the bit line, and the second signal may be read from the plate line.

(8) In the ferroelectric memory, the first voltage may be a positive voltage that is applied to the plate line, the second voltage may be a negative voltage that is applied to the plate line, wherein the first signal may be read from the bit line, and the second signal may be read from the bit line.

(9) In the ferroelectric memory, the plate line and the bit line may intersect each other.

(10) In the ferroelectric memory, the plate line and the bit line may be in parallel with each other.

DESCRIPTION OF EXEMPLARY EMBODIMENTS

Preferred embodiments of the invention are described below. It is noted that the embodiments to be described below do not unduly limit the contents of the invention set forth in the claimed invention. Also, compositions to be described in the embodiments are not necessarily indispensable as the solution provided by the invention.

1. Structure of Ferroelectric Memory

Figure 1:
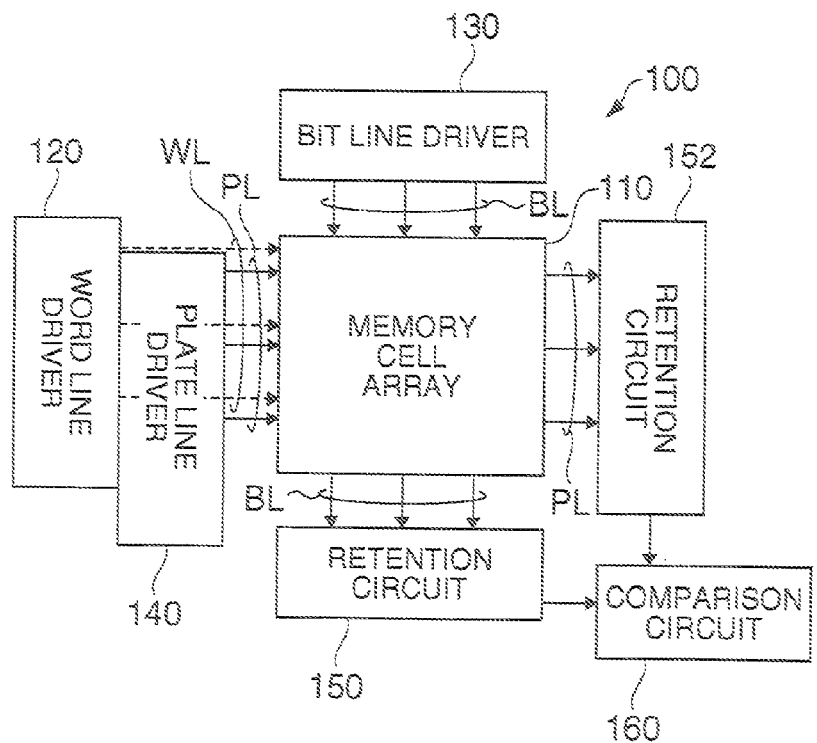
FIG. 1 is a diagram showing an overall structure of a ferroelectric memory in accordance with an embodiment of the invention.
Figure 2:
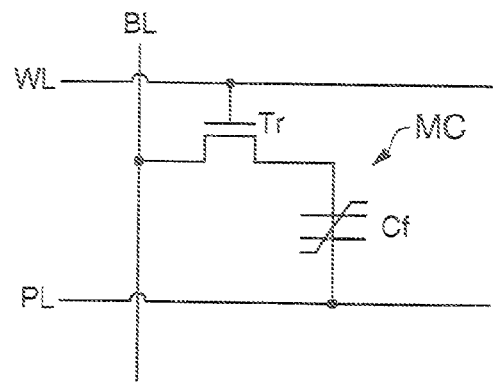
FIG. 2 is a diagram of an example of the structure of the ferroelectric memory shown in FIG. 1.

FIG. 1 is a diagram showing the overall structure of a ferroelectric memory in accordance with an embodiment of the invention, and FIG. 2 is a diagram showing an example of the structure of a memory cell of the ferroelectric memory shown in FIG. 1.

As shown in FIG. 1, the ferroelectric memory 100 includes a memory cell array 110, a word line driver 120, a bit line driver 130, a plate line driver 140, retention circuits 150 and 152, and a comparison circuit 180. Also, the ferroelectric memory 100 includes a plurality of word lines WL controlled by the word line driver 120, a plurality of bit lines BL controlled by the bit line driver 130, and a plurality of plate lines PL controlled by the plate line driver 140.

It is noted that the ferroelectric memory in accordance with the present embodiment may omit a part of its composition or include another composition added thereto, without being limited to the composition shown in FIG. 1. Alternatively, a plurality of sub-compositions may be combined to form the single composition shown in FIG. 1, or the single composition shown in FIG. 1 may be divided into a plurality of sub-compositions.

The memory cell array 110 includes a plurality of memory cells M arranged in an array configuration. As shown in FIG. 2, the memory cell M includes a ferroelectric capacitor Cf and an n-type MOS transistor Tr (a transistor in a broad sense). More specifically, the n-type MOS transistor Tr has a gate connected to the word line WL, a source connected to the bit line BL, and a drain connected to one end of the ferroelectric capacitor Cf. It is noted that, in this specification, one side of a transistor in a current path is called a drain and the other side is called a source, for the sake of convenience. The n-type MOS transistor Tr connects one end of the ferroelectric capacitor Cf to the bit line BL based on a voltage on the word line WL. Also, the other end of the ferroelectric capacitor Cf is connected to the plate line PL.

The word line driver 120 is connected to a plurality of word lines WL, and controls voltage on the word lines WL. More specifically, based on an address signal supplied from outside of the ferroelectric memory 100, the word line driver 120 sets the potential on specified word lines WL among the plural word lines higher than the potential on the other word lines WL, thereby selecting plural ones of the memory cells MC connected to the corresponding word lines WL.

The plate line driver 140 is connected to a plurality of plate lines PL, and controls the voltage on the plate lines PL. More specifically, based on an address signal supplied from outside of the ferroelectric memory 100, the plate line driver 140 sets the potential on specified plate lines PL among the plural plate lines higher than the potential on the other plate lines PL, thereby selecting the specified plate lines PL.

The bit line driver 130 is connected to a plurality of bit lines BL, and controls the voltage on the bit lines BL. When a selection voltage is impressed to the word line WL and the n-type MOS transistor Tr turns on, the voltage on the bit line BL is impressed to one end of the ferroelectric capacitor Cf.

In the illustrated example shown in FIG. 1, the word line WL and the plate line PL are disposed in parallel with each other, and the bit line BL is disposed intersecting the word line WL and the plate line PL.

The retention circuit 150 is connected to the bit line BL, and retains (stores) a signal read out from the memory cell MC. As shown in FIG. 1, the bit line driver 130 may be disposed on one side (on the upper side in FIG. 1) of the memory cell array 110, and the retention circuit 150 may be disposed on the other side (on the lower side in FIG. 1) of the memory cell array 110. The retention circuit 150 may only need to retain a signal read from the bit line BL, and may be formed, for example, with a capacitor that temporarily stores the signal. The retention circuits 150 and 152 may have a similar composition.

The retention circuit 152 is connected to the plate line PL, and retains (stores) a signal read out from the memory cell MC. As shown in FIG. 1, the bit line driver 140 may be disposed on one side (on the left side in FIG. 1) of the memory cell array 110, and the retention circuit 152 may be disposed on the other side (on the right side in FIG. 1) of the memory cell array 110. The retention circuit 152 may only need to retain a signal read from the plate line PL, and may be formed, for example, with a capacitor that temporarily stores the signal. The retention circuits 150 and 152 may have a similar composition.

The comparison circuit 160 is connected to outputs of the retention circuits 150 and 152, and performs a predetermined processing based on signals supplied from the retention circuits 150 and 152, thereby judging as to whether data is "1" or "0." More specifically, when the retention circuit 150 supplies a first signal $Q_1$ and the retention circuit 152 supplies a second signal $Q_2$ to the comparison circuit 160, the comparison circuit 160 judges that the data is first data (for example, data "1") when $Q_1/Q_2$ is greater than ½, and judges that the data is second data (for example, data "0") when $Q_1/Q_2$ is smaller than ½. In this case, a concrete processing mode performed by the comparison circuit 160 is not particularly limited. For example, a ratio of the first and second signals (for example, a voltage corresponding to $Q_1/Q_2$) may be calculated, and the ratio may be compared with a reference value (for example, a voltage corresponding to ½), whereby data "1" or data "0" may be judged based on the magnitudes of the two. It is noted that the reference voltage may be generated based on either of the first signal $Q_1$ or the second signal $Q_2$. Also, the comparison circuit 160 may function as a sense amplifier that amplifies an input and outputs the same.

2. Operation of Ferroelectric Memory

Figure 3:
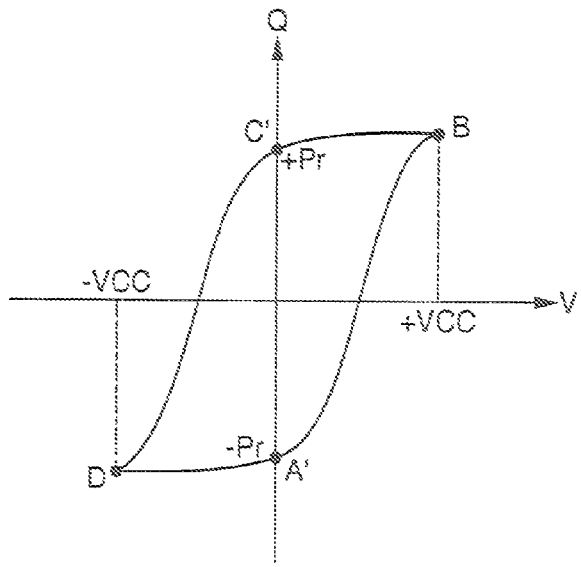
FIG. 3 is a graph showing a hysteresis characteristic of the ferroelectric capacitor.
Figure 4:
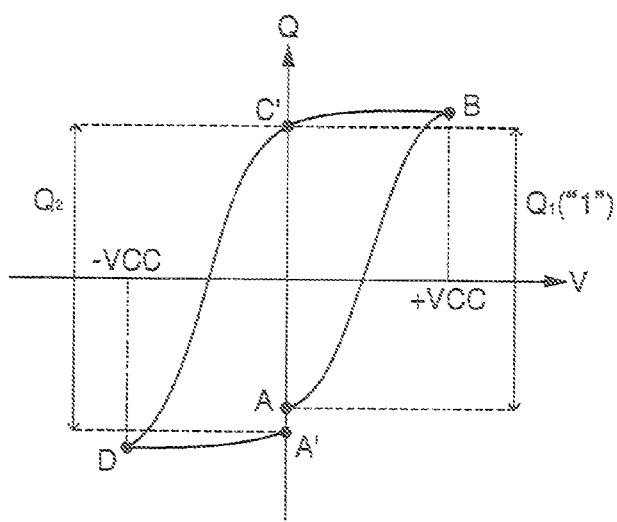
FIG. 4 is a graph showing a hysteresis characteristic of the ferroelectric capacitor.
Figure 5:
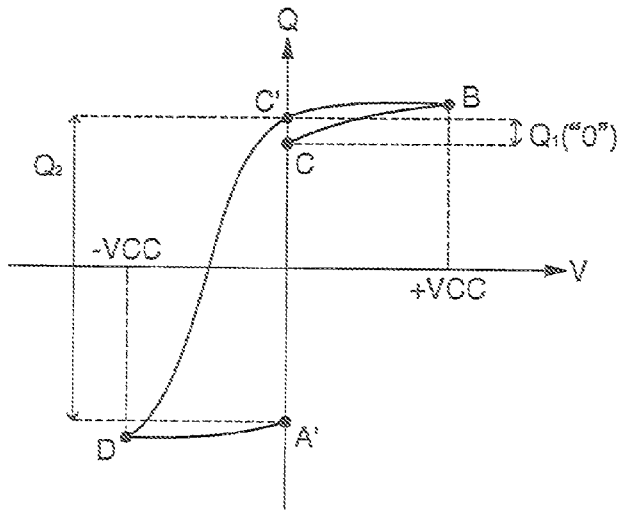
FIG. 5 is a graph showing a hysteresis characteristic of the ferroelectric capacitor.
Figure 6:
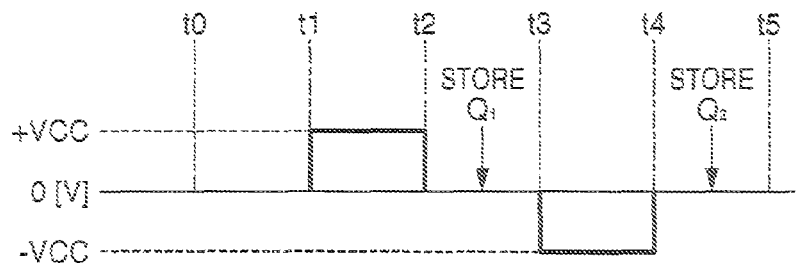
FIG. 6 is a chart showing voltages applied to the ferroelectric capacitor in a read-out operation.
Figure 7:
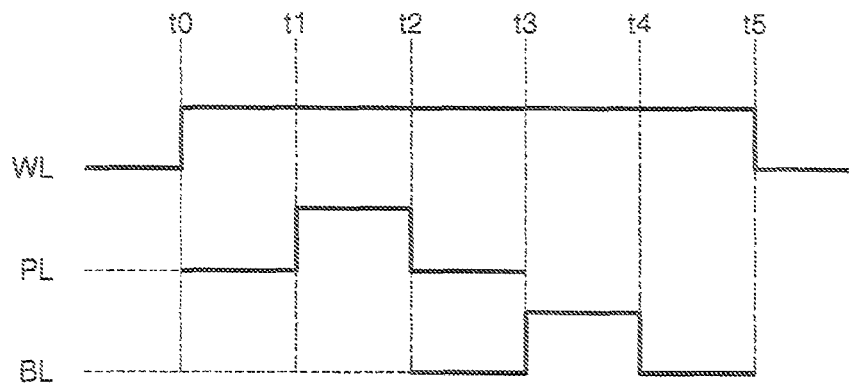
FIG. 7 is a chart showing voltages controlled in a read-out operation.

FIGS. 3-5 are graphs showing hysteresis characteristics of ferroelectric capacitors. Voltage applied to a ferroelectric capacitor is plotted along an axis of abscissas V, and the amount of polarization of the ferroelectric capacitor is plotted along an axis of ordinates Q. Also, FIG. 6 is a chart for describing voltages that are applied to the ferroelectric capacitor in a read-out operation, and the timing to store each signal. Further, FIG. 7 is a chart showing how voltages on the word line WL, the plate line PL and bit line BL are controlled in a read-out operation.

First, referring to FIG. 3, a read-out operation of a ferroelectric memory in accordance with an embodiment of the invention is described.

The ferroelectric memory 100 stores predetermined data based on a potential difference between one end and the other end of the ferroelectric capacitor Cf. More concretely, when data "1" is written in the memory cell MC, a selection voltage is applied to the word line WL to turn on the n-type MOS transistor Tr, the voltage on the plate line PL is set to 0V, and the voltage on the bit line BL is changed from VCC to 0V. By this, in the hysteresis characteristic shown in FIG. 3, the amount of polarization of the ferroelectric capacitor Cf changes from a point D to a point A', thereby exhibiting a negative state. In other words, the state in which the remanent polarization of the ferroelectric capacitor Cf is negative can be defined as a state that stores data "1."

On the other hand, when data "0" is written in the memory cell MC, a selection voltage is applied to the word line WL to turn on the n-type MOS transistor Tr, the voltage on the bit line BL is set to 0V, and the voltage on the plate line PL is changed from VCC to 0V. By this, in the hysteresis characteristic shown in FIG. 3, the amount of polarization of the ferroelectric capacitor Cf changes from a point B to a point C', thereby exhibiting a positive state. In other words, the state in which the remanent polarization of the ferroelectric capacitor Cf is positive can be defined as a state that stores data "0."

Next, referring to FIGS. 4-7, a read-out operation of the ferroelectric memory in accordance with an embodiment is described.

When data "1" is stored in the memory cell MC, as shown in FIG. 4, the remanent polarization of the ferroelectric capacitor Cf is eased from a point A' to a point A, depending on the time elapsed from the completion of writing and the start of reading. In other words, when data "1" is stored, the remanent polarization of the ferroelectric capacitor Cf at the start of a read-out operation is at the point A.

First, as shown in FIG. 7, at time t0, the word line driver 120 applies a selection voltage to specified ones of the plurality of word lines WL, and the selection voltage turns on n-type MOS transistors Tr of memory cells MC connected to the specified word lines WL to which the selection voltage is applied (selected word lines WL). By this operation, the corresponding ferroelectric capacitors Cf of the memory cells MC connected to the selected word lines WL are connected to the bit lines BL.

Next, as shown in FIG. 7, at time t1 to time t2, the plate line driver 140 elevates the voltage on specified ones of the plurality of plate lines PL to VCC. By this operation, as shown in FIG. 6, VCC (first voltage) with respect to the voltage on the bit line BL as a reference is applied to the ferroelectric capacitors Cf of the memory cells MC connected to the selected word lines WL. Then, as shown in FIG. 7, at time t2 to t3, the bit line driver 130 and the plate line driver 140 set both of the bit lines BL and the plate lines PL to 0V, whereby the voltage applied to the ferroelectric capacitors Cf of the memory cells MC connected to the selected word lines WL is set to 0V, as shown in FIG. 6.

By so doing, as shown in FIG. 4, at time t0 to t3, the amount of polarization of the ferroelectric capacitor Cf changes from a point A to a point B to a Point C', and the corresponding charge Q1 ("1") is discharged onto the bit line BL, such that the voltage on the bit line BL changes. In other words, a predetermined voltage as the first signal $Q_1$ appears on the bit line BL. Then, in accordance with the present embodiment, the first signal $Q_1$ is retained (stored) in the retention circuit 150 at any timing between time t2 and time t3 (for example, at an intermediate point between time t2 and time t3).

Thereafter, as shown in FIG. 7, at time t3 to t4, the bit line driver 130 elevates the voltage on the bit lines BL to VCC. By this operation, as shown in FIG. 6, -VCC (second voltage) with respect to the voltage on the bit line BL as a reference is applied to the ferroelectric capacitors Cf of the memory cells MC connected to the selected word lines WL. Then, as shown in FIG. 7, at time t4 to t5, the bit line driver 130 and the plate line driver 140 set both of the bit lines BL and the plate lines PL to 0V, whereby the voltage applied to the ferroelectric capacitors Cf of the memory cells MC connected to the selected word lines WL is set to 0V, as shown in FIG. 6.

By so doing, as shown in FIG. 4, at time t3 to t5, the amount of polarization of the ferroelectric capacitor Cf changes from a point C' to a point D to a Point A', and the corresponding charge $Q_2$ is discharged onto the plate line PL, such that the voltage on the plate line PL changes. In other words, a predetermined voltage as the second signal $Q_2$ appears on the plate line PL. Then, in accordance with the present embodiment, the second signal $Q_2$ is retained (stored) in the retention circuit 152 at any timing between time t4 and time t5 (for example, at an intermediate point between time t4 and time t5).

Then, the first and second signals $Q_1$ and $Q_2$ retained respectively by the retention circuits 150 and 152 are supplied to the comparison circuit 160 at a predetermined timing. The comparison circuit 160 generates a voltage corresponding to $Q_1/Q_2$ on one hand, generates a voltage corresponding to ½ on the other hand, and compares the magnitudes of the two voltages. When data "1" is stored in the memory cell MC, the value of $Q_1/Q_2$ obviously becomes greater than ½, as understood from FIG. 4, such that the determination of data "1" can be accurately made.

The read-out operation performed when data "1" is stored in a memory cell MC is described above. When data "0" is stored in a memory cell MC, only the variation in the amount of polarization of the ferroelectric capacitor Cf is different, but the voltage control in FIG. 6 and FIG. 7 is similarly conducted. A read-out operation conducted when data "0" is stored in a memory cell MC is described below.

When data "0" is stored in the memory cell MC, as shown in FIG. 5, the remanent polarization of the ferroelectric capacitor Cf is eased from a point C' to a point C, depending on the time elapsed from the completion of writing and the start of reading. In other words, when data "0" is stored, the remanent polarization of the ferroelectric capacitor Cf at the start of a read-out operation is at the point C.

First, as shown in FIG. 7, at time t0, the word line driver 120 applies a selection voltage to specified ones of the plurality of word lines WL, and the selection voltage turns on n-type MOS transistors Tr of memory cells MC connected to the specified word lines WL to which the selection voltage is applied (selected word lines WL). By this operation, the corresponding ferroelectric capacitors Cf of the memory cells MC connected to the selected word lines WL are connected to the bit lines BL.

Next, as shown in FIG. 7, at time t1 to time t2, the plate line driver 140 elevates the voltage on specified ones of the plurality of plate lines PL to VCC. By this operation, as shown in FIG. 6, VCC (first voltage) with respect to the voltage on the bit line BL as a reference is applied to the ferroelectric capacitors Cf of the memory cells MC connected to the selected word lines WL. Then, as shown in FIG. 7, at time t2 to t3, the bit line driver 130 and the plate line driver 140 set both of the bit lines BL and the plate lines PL to 0V, whereby the voltage applied to the ferroelectric capacitors Cf of the memory cells MC connected to the selected word lines WL is set to 0V, as shown in FIG. 6.

By so doing, as shown in FIG. 5, at time t0 to t3, the amount of polarization of the ferroelectric capacitor Cf changes from a point C to a point B to a Point C', and the corresponding charge Q1 ("0") is discharged onto the bit line BL, such that the voltage on the bit line BL changes. In other words, a predetermined voltage as the first signal $Q_1$ appears on the bit line BL. Then, in accordance with the present embodiment, the first signal $Q_1$ is retained (stored) in the retention circuit 150 at any timing between time t2 and time t3 (for example, at an intermediate point between time t2 and time t3).

Thereafter, as shown in FIG. 7, at time t3 to t4, the bit line driver 130 elevates the voltage on the bit lines BL to VCC. By this operation, as shown in FIG. 6, −VCC (second voltage) with respect to the voltage on the bit line BL as a reference is applied to the ferroelectric capacitors Cf of the memory cells MC connected to the selected word lines WL. Then, as shown in FIG. 7, at time t4 to t5, the bit line driver 130 and the plate line driver 140 set both of the bit lines BL and the plate lines PL to 0V, whereby the voltage applied to the ferroelectric capacitors Cf of the memory cells MC connected to the selected word lines WL is set to 0V, as shown in FIG. 6.

By so doing, as shown in FIG. 5, at time t3 to t5, the amount of polarization of the ferroelectric capacitor Cf changes from a point C' to a point D to a Point A', and the corresponding charge $Q_2$ is discharged onto the plate line PL, such that the voltage on the plate line PL changes. In other words, a predetermined voltage as the second signal $Q_2$ appears on the plate line PL. Then, in accordance with the present embodiment, the second signal $Q_2$ is retained (stored) in the retention circuit 152 at any timing between time t4 and time t5 (for example, at an intermediate point between time t4 and time t5).

Then, the first and second signals $Q_1$ and $Q_2$ retained respectively by the retention circuits 150 and 152 are supplied to the comparison circuit 160 at a predetermined timing. The comparison circuit 160 generates a voltage corresponding to $Q_1/Q_2$ on one hand, generates a voltage corresponding to ½ on the other hand, and compares the magnitudes of the two voltages. When data "0" is stored in the memory cell MC, the value of $Q_1/Q_2$ obviously becomes smaller than ½, as understood from FIG. 5, such that the determination of data "0" can be accurately made.

3. Consideration by Simulation

Next, ferroelectric memories in accordance with the embodiment of the invention are considered based on simulation results shown in FIGS. 8-15.

Figure 8:
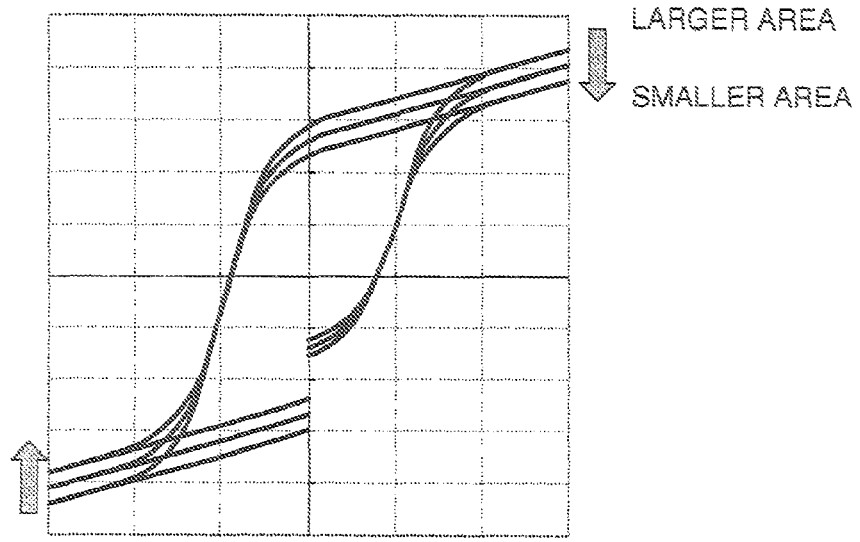
FIG. 8 is a graph showing changes in hysteresis curves in defective modes.
Figure 9:
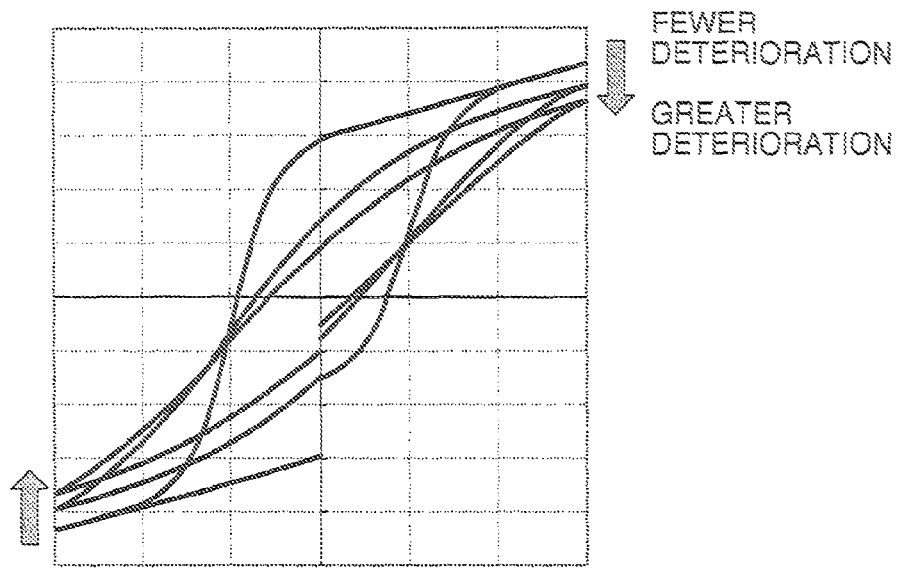
FIG. 9 is a graph showing changes in hysteresis curves in defective modes.

FIGS. 8 and 9 are graphs showing changes in the hysteresis curve of ferroelectric capacitors in defective modes (irregular capacitor areas in FIG. 8, and deterioration of capacitors in FIG. 9), which influence the amount of read-out signals of the ferroelectric memories. It is observed from the graphs that the hysteresis curve changes only in its magnitude when there are differences in the capacitor area, but the shape of the hysteresis curve substantially changes when the ferroelectric capacitor deteriorates.

Figure 10:
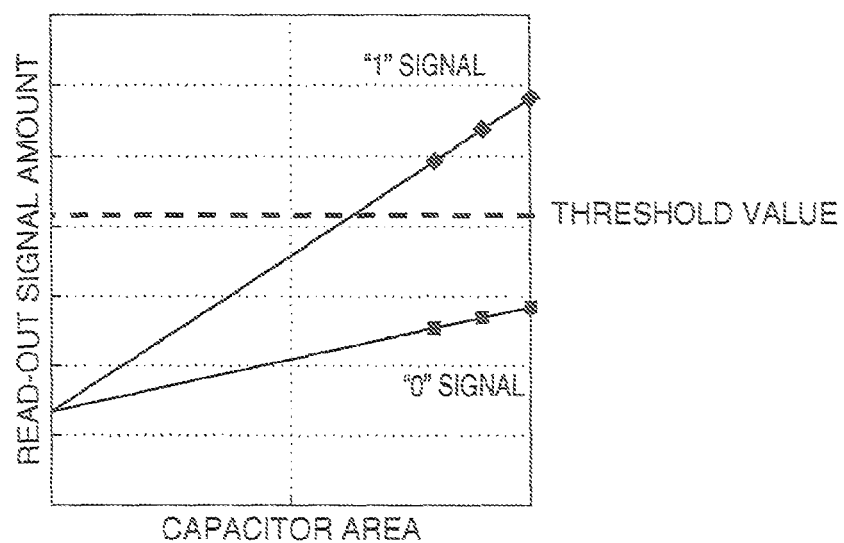
FIG. 10 is a graph showing a simulation result given by a comparison example.
Figure 11:
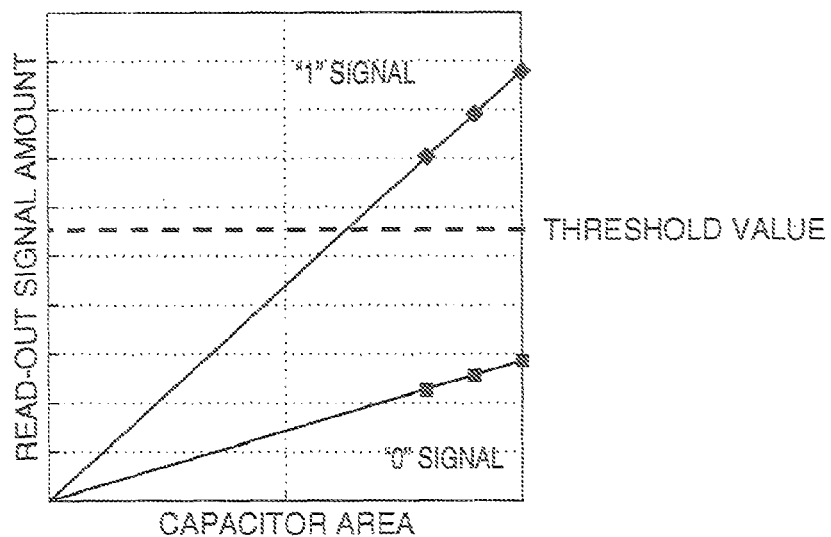
FIG. 11 is a graph showing a simulation result given by a comparison example.
Figure 12:
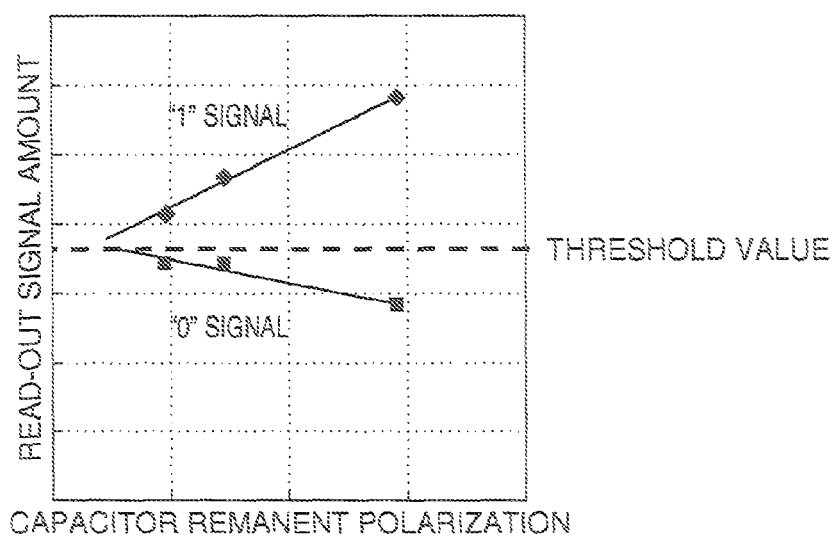
FIG. 12 is a graph showing a simulation result given by a comparison example.
Figure 13:
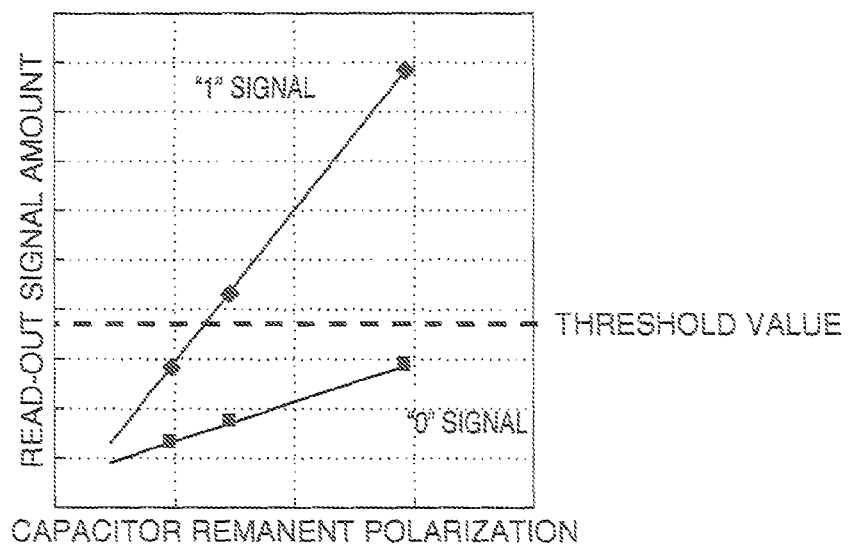
FIG. 13 is a graph showing a simulation result given by a comparison example.

How the amount of read-out signal of the ferroelectric memory changes when the defective modes occur is considered. FIGS. 10-13 show changes in the amount of read-out signal by comparison examples. More specifically, FIGS. 10 and 11 are graphs showing capacitor area dependency when the defective mode shown in FIG. 8 is present, and FIGS. 12 and 13 are graphs showing capacitor remanent polarization dependency when the defective mode shown in FIG. 9 is present.

In general, as shown in FIGS. 10 and 12, a read-out operation is conducted by using the amount of read-out signal obtained when a voltage VCC is applied to a ferroelectric capacitor. For comparison with the present embodiment, the amount of read-out signal obtained when a voltage VCC is applied to a ferroelectric capacitor and then the voltage is changed to 0V is also considered. It is observed from these results that, in the case of capacitor area irregularity, some reduction in the read-out margin appears. On the other hand, it is observed that, in the case of capacitor deterioration, a considerable change appears in the amount of read-out signal (particularly, in the "1" signal), and the threshold value becomes nonfunctional and read-out failures occur.

Figure 14:
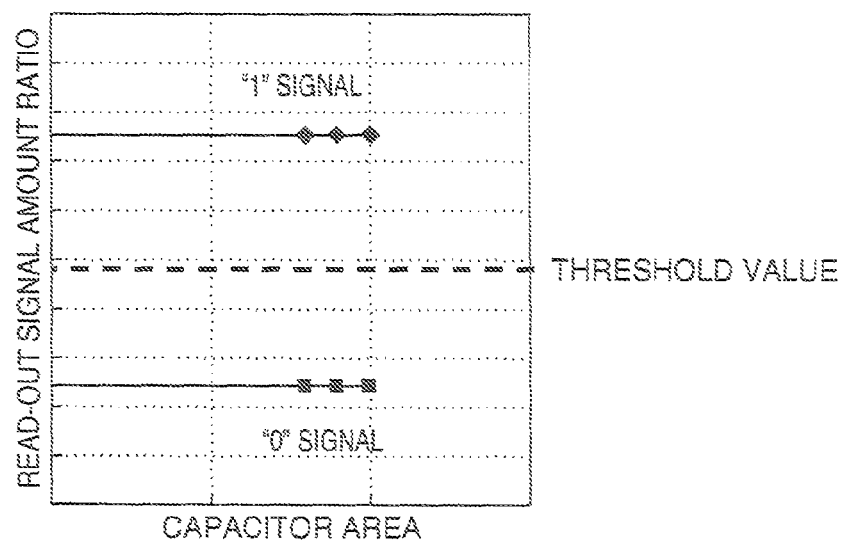
FIG. 14 is a graph showing a simulation result given by an embodiment of the invention.
Figure 15:
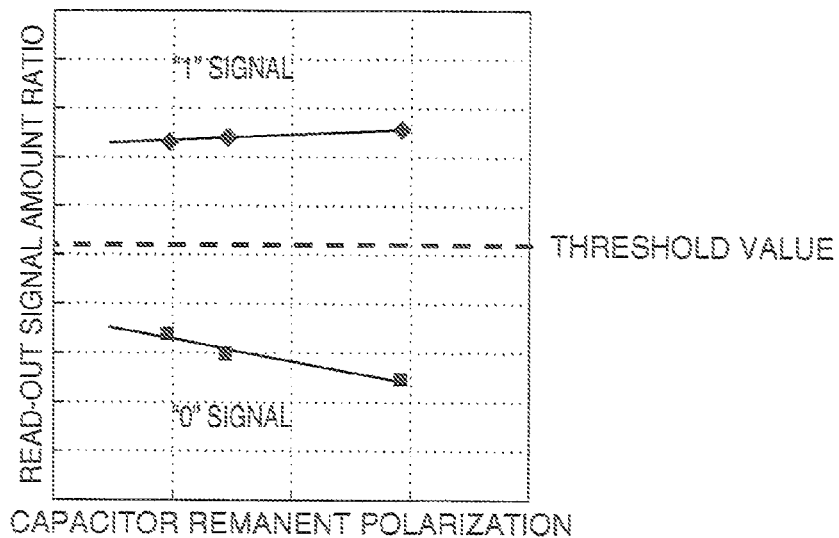
FIG. 15 is a graph showing a simulation result given by an embodiment of the invention.

FIGS. 14 and 15 are graphs showing changes in the amount of read-out signal in accordance with the present embodiment. In comparison with the comparison examples in FIGS. 11 and 13, when the mode of voltage application to ferroelectric capacitors is the same, it is observed that the ferroelectric memory in accordance with the present embodiment is not influenced at all by capacitor area irregularity, and has almost no influence by capacitor deterioration. In other words, by the ferroelectric memories in accordance with the present embodiment, even when differences are present in the areas of the ferroelectric capacitors, and deterioration occurs in the ferroelectric capacitors, read-out data can be accurately judged.

By the ferroelectric memory in accordance with the present embodiment, read-out data can be judged with a single memory cell, and therefore a separate reference memory cell does not need to be provided, such that a reduction in area of the ferroelectric memory and a higher level of integration can be achieved. Data stored in a memory cell is judged based on a ratio between the first and second signals $Q_1$ and $Q_2$. Therefore, the ratio between the two signals is not influenced even when a change occurs in the characteristics of the ferroelectric capacitor due to deterioration thereof, such that read-out data can be accurately judged. Furthermore, for similar reasons, even when differences are present in the areas of the ferroelectric capacitors in the memory cells, read-out errors do not occur and therefore read-out data can be accurately judged.

Also, in accordance with the present embodiment, a read-out operation is conducted based on first and second signals $Q_1$ and $Q_2$ read out in a state in which a voltage VCC is applied to a ferroelectric capacitor and then the voltage is returned to 0V. As a result, the amount of a read-out signal by a portion based on the linear permittivity of the ferroelectric capacitor is excluded, such that differences in the amount of read-out signals due to differences in the permittivity of ferroelectric capacitors do not need to be considered, and therefore data can be more accurately read out.

4. Modified Examples

It is noted that the invention is not limited to the embodiment described above, and many changes can be made and implemented within the scope of the subject matter of the invention. Modified examples of the embodiment are described below.

Figure 16:
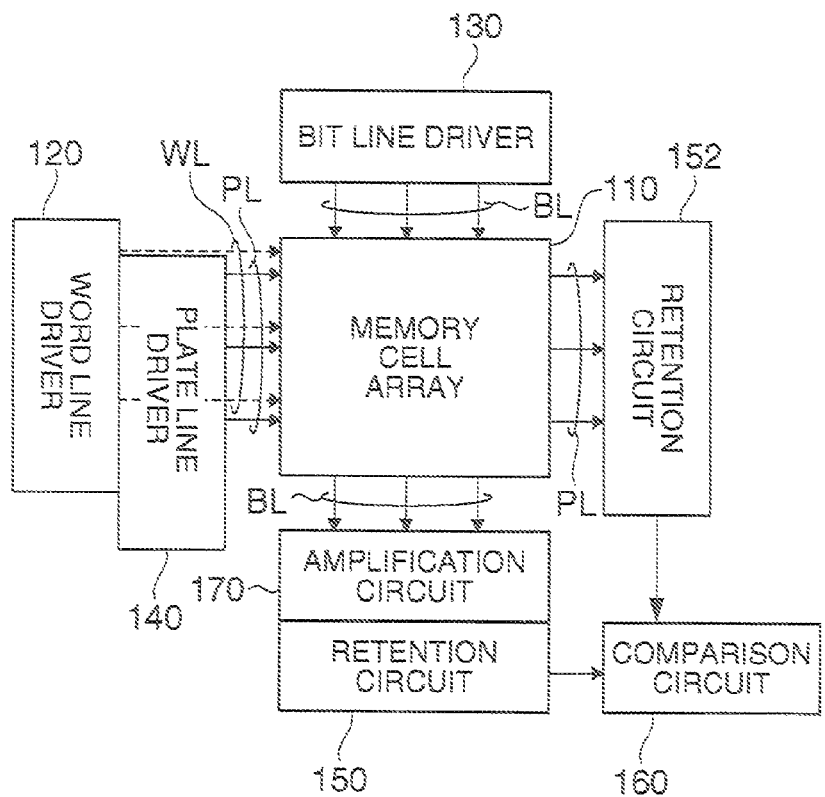
FIG. 16 is a diagram for describing a first modified example of the embodiment of the invention.

FIG. 16 is a diagram showing an overall structure of a ferroelectric memory in accordance with a first modified example of the embodiment. As shown in FIG. 16, an amplification circuit 170 is provided on the input side of a retention circuit 150.

For example, the amplification circuit 170 has a circuit structure that doubles a first signal $Q_1$ outputted from a bit line BL of a memory cell array 110. More concretely, the amplification circuit 170 amplifies a voltage corresponding to the first signal $Q_1$ appearing on the bit line BL to twice the voltage. An output signal of the amplification circuit 170 is supplied to the comparison circuit 160, and the comparison circuit 160 judges that data stored in the corresponding memory cell is first data (for example, data "1") when $2Q_1$ is greater than $Q_2$, and second data (for example, data "0") when $2Q_1$ is smaller than $Q_2$. For example, the comparison circuit 160 may be a differential sense amplifier such as a latch type sense amplifier. In accordance with the modified example, the amplification circuit 170 is provided, such that the structure of the comparison circuit 160 can be simplified as the comparison circuit 160 only needs to compare the magnitudes of the signals.

Figure 17:
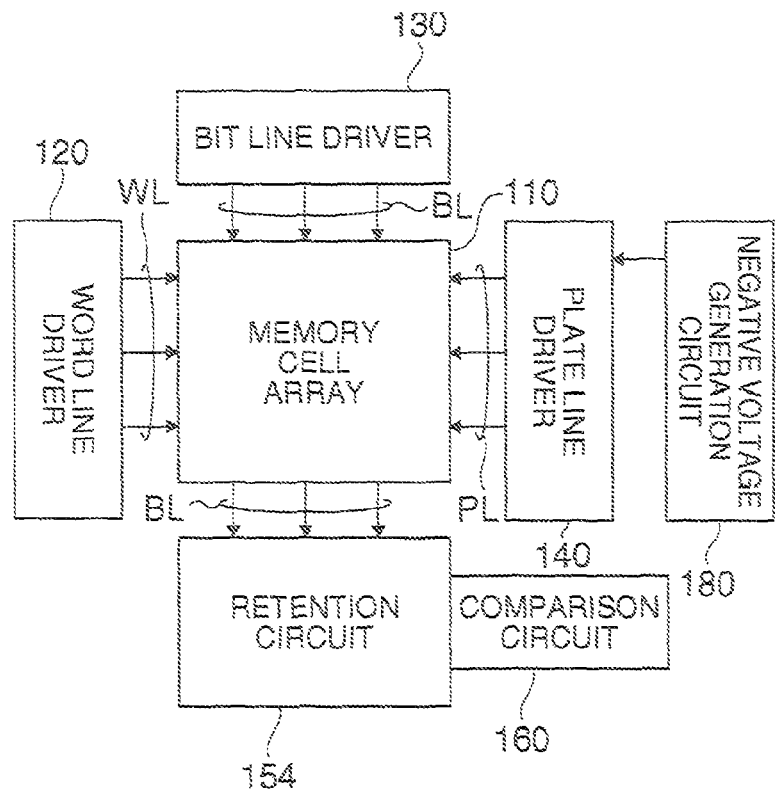
FIG. 17 is a diagram for describing a second modified example of the embodiment of the invention.
Figure 18:
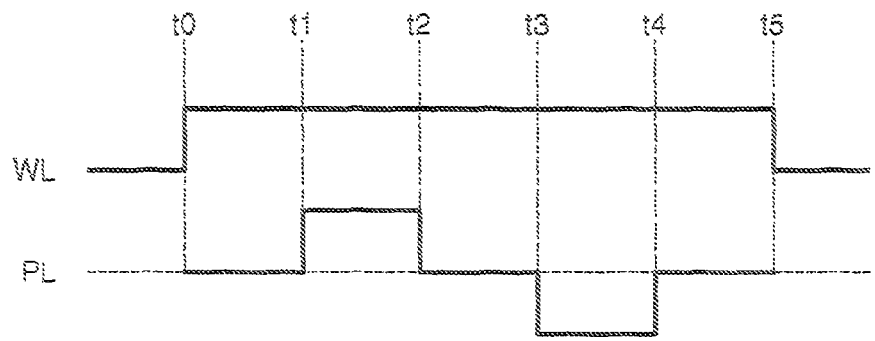
FIG. 18 is a chart for describing the second modified example of the embodiment of the invention.

FIG. 17 is a diagram showing the overall structure of a ferroelectric memory in accordance with a second modified example of the embodiment, and FIG. 18 is a voltage control chart showing voltages on a word line WL, a plate line PL and a bit line BL in a read-out operation. As shown in FIG. 17, a negative voltage generation circuit 180 that supplies a negative voltage to the plate lines PL is provided, and a retention circuit 154 is provided at the bit lines BL.

In the present modified example, as shown in FIG. 18, at time t3 to t4, a plate line driver 140 impresses a negative voltage −VCC to the plate line PL based on a voltage supplied from the negative voltage generation circuit 180. By this operation, −VCC with a voltage on the bit line BL as a reference can be impressed to the ferroelectric capacitor Cf of the memory cell MC connected to the selected word line WL. Then, as shown in FIG. 18, at time t4 to t5, the bit line driver 130 and the plate line driver 140 set the voltage on the bit line BL and the plate line PL to 0V, thereby setting the voltage impressed to the ferroelectric capacitor Cf of the memory cell MC connected to the selected word line WL to 0V.

In this manner, in accordance with the present modified example, both of the first and second signals $Q_1$ and $Q_2$ appear as voltages on the bit line BL, such that the comparison circuit 160 only needs to perform processing based on voltages supplied from the bit line BL through the retention circuit 154, and therefore the overall circuit structure can be greatly simplified. Also, the retention circuit 154 needs to retain signals supplied only from the bit line BL, such that its circuit structure can be simplified.

Figure 19:
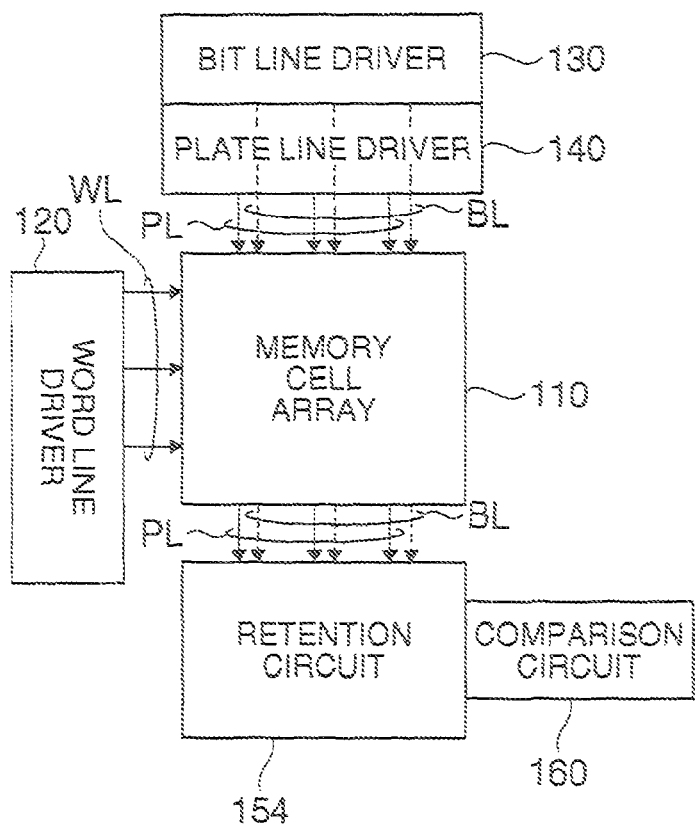
FIG. 19 is a diagram for describing a third modified example of the embodiment of the invention.

FIG. 18 is a diagram showing an overall structure of a ferroelectric memory in accordance with a third modified example of the present embodiment. As shown in FIG. 19, bit lines BL and plate lines PL are disposed in parallel with each other, and word lines WL are disposed intersecting the bit lines BL and the plate lines PL. By this arrangement, the circuit structure of a retention circuit 154 that retains a first signal $Q_1$ appearing on the bit line BL and a second signal $Q_2$ appearing on the plate line PL can be simplified.

It is noted that a variety of other changes can be implemented in the invention. For example, the retention circuit (second retention circuit) that retains the second signal $Q_2$ described above may be omitted, and the second signal $Q_2$ may be directly supplied to the comparison circuit.

What is claimed is:

1. A ferroelectric memory comprising:
a memory cell having a ferroelectric capacitor, wherein, in a read-out operation, a first signal $Q_1$ is given when a first voltage is applied to the ferroelectric capacitor, wherein the first signal is based on a variation in an amount of polarization generated when a voltage magnitude applied to the ferroelectric capacitor changes from 0V to the first voltage and returns to 0V, and
a second signal $Q_2$ is given when a second voltage having an identical magnitude as the first voltage in a different polarity is applied to the ferroelectric capacitor, wherein the second signal is based on a variation in an amount of polarization generated when the voltage magnitude applied to the ferroelectric capacitor changes from 0V to the second voltage and returns to 0V; and
an amplification circuit that doubles the first signal, wherein a comparison circuit judges that the memory cell stores first data when 2Q1 is greater than Q2, and the comparison circuit judges that the memory cell stores second data when 2Q1 is smaller than Q2.

2. A ferroelectric memory according to claim 1, comprising a first retention circuit that retains the first signal, wherein the comparison circuit judges based on the first and second signals as to whether the memory cell stores the first data or the second data.

3. A ferroelectric memory according to claim 2, comprising a second retention circuit that retains the second signal, wherein the comparison circuit takes in the first and second signals supplied from the first and second retention circuits.

4. A ferroelectric memory according to claim 1, comprising a bit line connected through a transistor to one end of the ferroelectric capacitor, and a plate line connected to the other end of the ferroelectric capacitor.

5. A ferroelectric memory according to claim 4, wherein the first voltage is a positive voltage that is applied to the plate line, the second voltage is a positive voltage that is applied to the bit line, wherein the first signal is read from the bit line, and the second signal is read from the plate line.

6. A ferroelectric memory according to claim 4, wherein the first voltage is a positive voltage that is applied to the plate line, the second voltage is a negative voltage that is applied to the plate line, wherein the first signal is read from the bit line, and the second signal is read from the bit line.

7. A ferroelectric memory according to claim 4, wherein the plate line and the bit line intersect each other.

8. A ferroelectric memory according to claim 4, wherein the plate line and the bit line are in parallel with each other.

* * * * *